United States Patent
Kim et al.

(10) Patent No.: US 11,316,655 B2
(45) Date of Patent: Apr. 26, 2022

(54) DEVICE AND METHOD WITH WIRELESS COMMUNICATION

(71) Applicant: Samsung Electronics Co., Ltd., Suwon-si (KR)

(72) Inventors: Seong Joong Kim, Hwaseong-si (KR); Joonseong Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 77 days.

(21) Appl. No.: 16/850,202

(22) Filed: Apr. 16, 2020

(65) Prior Publication Data

US 2021/0143973 A1     May 13, 2021

(30) Foreign Application Priority Data

Nov. 12, 2019 (KR) .......................... 10-2019-0144156

(51) Int. Cl.
| | |
|---|---|
| *H04L 7/00* | (2006.01) |
| *H03L 7/081* | (2006.01) |
| *H04L 7/033* | (2006.01) |
| *H03M 1/12* | (2006.01) |
| *H04B 5/02* | (2006.01) |

(52) U.S. Cl.
CPC .......... *H04L 7/0041* (2013.01); *H03L 7/0814* (2013.01); *H03L 7/0816* (2013.01); *H04L 7/033* (2013.01); *H03M 1/12* (2013.01); *H04B 5/02* (2013.01)

(58) Field of Classification Search
CPC ....... H04L 7/033; H04L 7/0041; H04L 27/02; H04L 27/06; H04L 27/066; H03M 1/12; H04B 5/02; H03L 7/0812; H03L 7/0814; H03L 7/0816; H03L 7/0818
See application file for complete search history.

(56) References Cited

U.S. PATENT DOCUMENTS

| | | | | |
|---|---|---|---|---|
| 3,701,852 A | * | 10/1972 | Robert ................. | H04L 27/02 370/491 |
| 5,731,848 A | * | 3/1998 | Patel ................. | H04N 21/426 348/614 |
| 5,969,553 A | * | 10/1999 | Kishi ................. | H03L 7/0812 327/158 |

(Continued)

FOREIGN PATENT DOCUMENTS

| | | |
|---|---|---|
| KR | 10-1466850 61 | 12/2014 |
| KR | 10-2017-0034986 A | 3/2017 |

(Continued)

OTHER PUBLICATIONS

Lee et al., "A Fully Integrated High Security NFC Target IC Using 0.18 μm CMOS Process", *2011 Proceedings of the ESSCIRC (ESSCIRC)*, 2011, (pp. 551-554).

(Continued)

*Primary Examiner* — James M Perez
(74) *Attorney, Agent, or Firm* — NSIP Law

(57) ABSTRACT

A device with wireless communication includes: an input receiver configured to receive an input signal having a carrier frequency; a delay circuit configured to generate a delayed signal by delaying the input signal; and a clock generator configured to generate a clock signal having a clock frequency based on the delayed signal and the input signal.

31 Claims, 13 Drawing Sheets

(56) References Cited

U.S. PATENT DOCUMENTS

| | | | |
|---|---|---|---|
| 6,281,725 B1* | 8/2001 | Hanzawa | H03K 5/135 327/152 |
| 6,621,527 B1* | 9/2003 | Limberg | H04N 21/426 348/725 |
| 6,987,410 B2* | 1/2006 | Suda | H04L 1/24 327/165 |
| 7,073,098 B2* | 7/2006 | Kozaki | H03L 7/0816 714/700 |
| 7,436,265 B2* | 10/2008 | Park | H03L 7/08 331/18 |
| 7,907,005 B2* | 3/2011 | Kranabenter | H03D 1/22 329/311 |
| 8,036,320 B2* | 10/2011 | Iida | H04L 25/4902 375/340 |
| 8,121,237 B2* | 2/2012 | Stott | G11C 7/222 375/355 |
| 8,339,353 B2* | 12/2012 | Kim | G09G 5/18 345/99 |
| 8,451,939 B2* | 5/2013 | Nakasha | H03K 7/04 375/295 |
| 8,736,341 B2* | 5/2014 | Mizutani | H03L 7/24 327/295 |
| 8,923,383 B2* | 12/2014 | Kim | H04L 25/4902 375/238 |
| 8,958,390 B2* | 2/2015 | Heinrich | G01S 19/235 370/331 |
| 9,071,283 B2* | 6/2015 | Shana'a | H04B 17/12 |
| 9,124,413 B2* | 9/2015 | Savoj | H03L 7/0891 |
| 9,485,085 B2* | 11/2016 | Arcudia | H04L 7/041 |
| 9,509,319 B1* | 11/2016 | Chattopadhyay | H03L 7/093 |
| 9,577,638 B2* | 2/2017 | Chen | H04W 24/02 |
| 9,723,635 B2* | 8/2017 | Nambord | H04B 5/0031 |
| 9,800,300 B2* | 10/2017 | Caruana | H04B 7/028 |
| 9,917,586 B2* | 3/2018 | Chen | G01R 23/00 |
| 10,044,413 B2* | 8/2018 | Cho | G06K 7/10237 |
| 10,484,215 B2* | 11/2019 | Wicaksana | H04L 27/0014 |
| 10,686,582 B1* | 6/2020 | Pasdast | G06F 1/10 |
| 10,903,842 B2* | 1/2021 | Kim | H03L 7/0891 |
| 2001/0015664 A1* | 8/2001 | Taniguchi | H03L 7/0816 327/158 |
| 2003/0188235 A1* | 10/2003 | Kozaki | H03L 7/0816 714/700 |
| 2004/0251973 A1* | 12/2004 | Ishida | H03L 7/0816 331/16 |
| 2006/0222114 A1* | 10/2006 | Lee | H04L 7/046 375/343 |
| 2007/0001724 A1* | 1/2007 | Na | H03L 7/10 327/158 |
| 2008/0012615 A1* | 1/2008 | Park | H03L 7/0814 327/158 |
| 2008/0088507 A1* | 4/2008 | Smith | G01S 5/10 342/386 |
| 2008/0240170 A1* | 10/2008 | Elmala | H01Q 3/2682 370/517 |
| 2009/0309652 A1* | 12/2009 | Kranabenter | H04L 27/06 329/347 |
| 2010/0164853 A1* | 7/2010 | Kim | G09G 3/20 345/99 |
| 2012/0268181 A1* | 10/2012 | Fujimaki | H03L 7/0816 327/158 |
| 2013/0099959 A1* | 4/2013 | Matsuo | G01S 7/292 342/189 |
| 2014/0017997 A1* | 1/2014 | Sung | H04B 5/0031 455/41.1 |
| 2014/0171002 A1* | 6/2014 | Park | H04L 25/067 455/226.1 |
| 2014/0173387 A1* | 6/2014 | Park | H04L 27/06 714/792 |
| 2014/0192931 A1* | 7/2014 | VandeBeek | H04B 5/0031 375/320 |
| 2014/0273828 A1* | 9/2014 | Yang | H03D 3/009 455/41.1 |
| 2014/0348183 A1* | 11/2014 | Kim | H04L 7/0008 370/503 |
| 2015/0004909 A1* | 1/2015 | Agrawal | H04B 5/0031 455/41.1 |
| 2015/0118963 A1* | 4/2015 | Yoon | H04B 5/0031 455/41.1 |
| 2015/0146819 A1* | 5/2015 | Chowdhury | H03F 1/0227 375/296 |
| 2015/0256324 A1* | 9/2015 | Kang | H04B 5/0031 375/371 |
| 2016/0087681 A1* | 3/2016 | Dhayni | H04B 5/0068 455/41.1 |
| 2017/0085298 A1* | 3/2017 | Cho | H04B 5/0025 |
| 2017/0102465 A1* | 4/2017 | Yu | G01S 19/36 |
| 2017/0135600 A1* | 5/2017 | Chien | A61B 5/0507 |
| 2017/0237442 A1* | 8/2017 | Kim | H03L 7/091 327/142 |
| 2017/0288741 A1* | 10/2017 | Zhu | H04B 5/02 |
| 2018/0191366 A1* | 7/2018 | Snoeij | H03L 7/08 |
| 2018/0248722 A1* | 8/2018 | Wicaksana | G06K 19/0723 |
| 2019/0190554 A1* | 6/2019 | Srinivasan | H04B 1/12 |
| 2020/0112932 A1* | 4/2020 | Gruber | H04W 56/0015 |
| 2020/0195254 A1* | 6/2020 | Kim | H03L 7/0891 |
| 2021/0143973 A1* | 5/2021 | Kim | H03L 7/0807 |
| 2021/0159944 A1* | 5/2021 | Kim | H04L 7/0331 |
| 2021/0260383 A1* | 8/2021 | Meskens | A61N 1/37252 |

FOREIGN PATENT DOCUMENTS

| | | |
|---|---|---|
| KR | 10-2019-0033767 A | 4/2019 |
| WO | WO 2017/095328 A1 | 6/2017 |

OTHER PUBLICATIONS

Lien, Wee Liang et al., "A Self-Calibrating NFC SoC with a Triple-Mode Reconfigurable PLL and a Single-Path PICC-PCD Receiver in 0.11 μm CMOS", *2014 IEEE International Solid-State Circuits Conference Digest of Technical Papers (ISSCC)*, 2014 (pp. 158-160).

Fiore, Vincenzo et al., "30.4 A 13.56MHz RFID Tag with Active Envelope Detection in an Organic Complementary TFT Technology", *2014 IEEE International Solid-State Circuits Conference Digest of Technical Papers (ISSCC)*, 2014 (pp. 492-494).

Extended European search Report dated Feb. 23, 2021 in counterpart EP Application No. 20195393.2 (8 pages in English).

\* cited by examiner

DEVICE AND METHOD WITH WIRELESS COMMUNICATION

CROSS-REFERENCE TO RELATED APPLICATIONS

This application claims the benefit under 35 USC § 119(a) of Korean Patent Application No. 10-2019-0144156 filed on Nov. 12, 2019 in the Korean Intellectual Property Office, the entire disclosure of which is incorporated herein by reference for all purposes.

BACKGROUND

1. Field

The following description relates to technology for recovering a clock frequency signal.

2. Description of Related Art

An ultra-low-power wireless transceiver is may be implemented in low-power wireless communication fields (for example, wireless sensor nodes, telemetry, and the like) where battery size and battery exchangeability are limited. In low-power wireless communications, a frequency synthesizer (for example, a phase-locked loop (PLL) or a voltage-controlled oscillator (VCO)) may account for the greatest portion of overall power consumption of a wireless transmission chip.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a device with wireless communication includes: an input receiver configured to receive an input signal having a carrier frequency; a delay circuit configured to generate a delayed signal by delaying the input signal; and a clock generator configured to generate a clock signal having a clock frequency based on the delayed signal and the input signal.

The delayed signal may have a carrier-off interval at a point in time different from a point in time of a carrier-off interval of the input signal.

The delayed signal may have individual carrier-off intervals at points in time different from points in time of all carrier-off intervals among carrier-off intervals of the input signal.

The delayed signal may have a carrier-off interval at a point in time corresponding to a point in time of a carrier-on interval of the input signal.

The delay circuit may be further configured to generate the delayed signal by delaying the input signal for a preset time length corresponding to a coding scheme applied to the input signal.

The delay circuit may be further configured to generate the delayed signal by delaying the input signal for a time length between a first-quarter interval and a third-quarter interval, among four quarter intervals of a symbol period of the input signal.

The delay circuit may be further configured to generate the delayed signal by delaying the input signal for a half period of a symbol period.

The device may further include: a delay-locked loop (DLL) configured to adjust a time length for which the input signal is delayed by the delay circuit to a target delay time.

The DLL may be further configured to change a control signal setting a delay time length of the delay circuit, in response to a difference between a current delay time of the delayed signal and the target delay time being greater than or equal to a threshold difference.

The DLL may be further configured to maintain a delay time length of the delay circuit and be at least partially deactivated, in response to a difference between a current delay time of the delayed signal and the target delay time being less than a threshold difference.

The DLL may be further configured to adjust a delay time length of the delay circuit during a polling time of the input signal after the input signal is received.

The DLL may be further configured to adjust a delay time length of the delay circuit during a guard time between a transmission operation and a reception operation in a near field communication (NFC) tag.

The DLL may be further configured to initiate adjusting a delay time length of the delay circuit, in response to an interrupt signal generated at either one or both of an initial point in time at which a signal is received from outside environment and a guard time between a transmission operation and a reception operation.

The clock generator may be further configured to generate the clock signal based on a logical sum result signal of the input signal and the delayed signal.

The clock generator may include a divider configured to generate the clock signal by dividing the logical sum result signal.

The device may further include: a digital baseband (DBB) unit configured to operate using the generated clock signal.

The input receiver may include an analog-to-digital converter (ADC) configured to receive an analog input signal from an outside environment and convert the analog input signal into a digital input signal constituting the input signal having the carrier frequency.

In another general aspect, a method of recovering a clock frequency includes: receiving an input signal having a carrier frequency; generating a delayed signal by delaying the input signal; and generating a clock signal having a clock frequency from the delayed signal and the input signal.

The delayed signal may have carrier-off intervals that are non-overlapping with carrier-off intervals of the input signal.

A timing of a carrier-off interval of the delayed signal may correspond to a timing of a carrier-on interval of the input signal.

The method may further include: adjusting a time length for which the input signal is delayed to a target delay time.

The adjusting of the time length for which the input signal is delayed may include: changing a control signal setting a delay time length of a delay circuit, in response to a difference between a current delay time of the delayed signal and the target delay time being greater than or equal to a threshold difference; or maintaining the delay time length of the delay circuit and at least partially deactivating the delay circuit, in response to the difference between the current delay time of the delayed signal and the target delay time being less than the threshold difference.

The adjusting of the time length for which the input signal is delayed may include adjusting a delay time length of a delay circuit during a polling time of the input signal after the input signal is received.

The adjusting of the time length for which the input signal is delayed may include adjusting a delay time length of a delay circuit during a guard time between a transmission operation and a reception operation in a near field communication (NFC) tag.

The adjusting of the time length for which the input signal is delayed may include initiating adjusting a delay time length of a delay circuit, in response to an interrupt signal generated at either one or both of an initial point in time at which a signal is received from an outside environment and a guard time between a transmission operation and a reception operation.

The generating of the clock signal may include dividing a logical sum result signal of the input signal and the delayed signal.

In another general aspect, a device with wireless communication includes: an input receiver configured to receive an input signal having a carrier frequency; a delay circuit configured to generate a delayed signal by delaying the input signal; a delay-locked loop (DLL) configured to control operation of the delay circuit by setting a delay time length of the delay circuit based on a target delay time of the delayed signal; and a clock generator configured to generate a clock signal having a clock frequency based on the delayed signal and the input signal.

The DLL may be configured to adjust the delay time length of the delay circuit until a difference between a current delay time of the delayed signal and the target delay time is less than a threshold difference. The DLL may be configured to deactivate elements of the DLL in response to the difference between the current delay time and the target delay time being less than the threshold difference.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
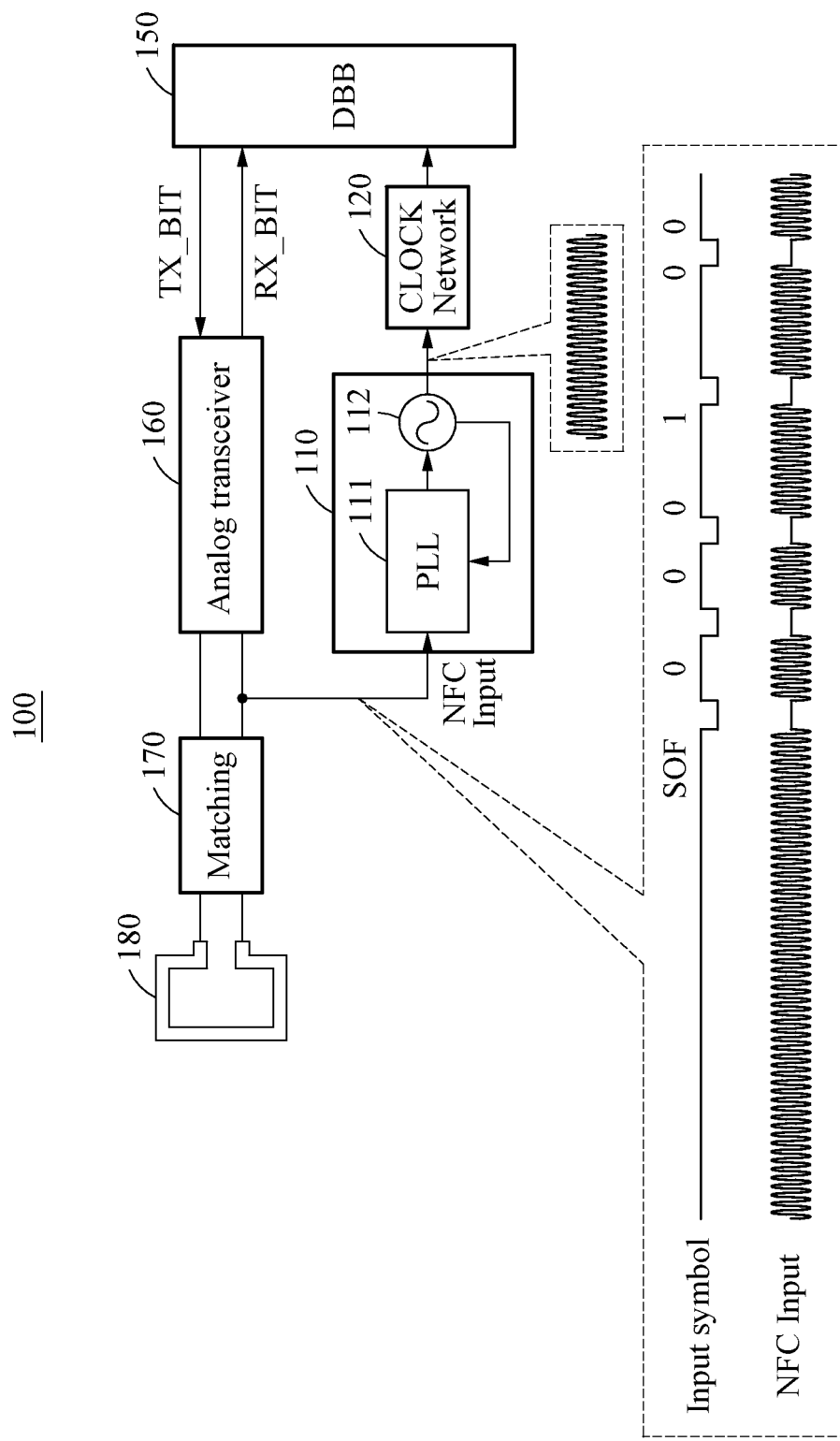
FIG. 1 illustrates an example of clock frequency recovery.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

According to example embodiments disclosed herein, overall power consumption in a low-power wireless communication device and method may be reduced by reducing the power consumption of blocks consuming a large amount of power.

FIG. 1 illustrates an example of clock frequency recovery.

Referring to FIG. 1, a wireless communication device 100 may include a clock recovery unit 110, a clock network 120, a digital baseband (DBB) unit 150, an analog transceiver 160, a matching unit 170, and an antenna 180, for example. The wireless communication device 100 may perform tag communication by near field communication (NFC).

The clock recovery unit 110 may recover a clock signal with a clock frequency from an input of the antenna 180 received from an outside environment. For example, the clock recovery unit 110 includes a phase-locked loop (PLL) 111, and an oscillator 112. The PLL 111 tracks a carrier frequency of an external signal and locks the tracked frequency and a phase of the external signal. The oscillator 112 oscillates with the frequency locked by the PLL 111. The clock network 120 divides the recovered clock signal.

The analog transceiver 160 modulates a digital signal received from the DBB unit 150 to a frequency of a communication band (for example, a near field frequency), or demodulates an external signal received at a frequency of a communication band to a baseband (BB).

The DBB unit 150 transmits a digital signal to the analog transceiver 160 or receives a digital signal from the analog transceiver 160, for communication. The DBB unit 150 performs digital processing of demodulation and modulation.

The matching unit 170 performs impedance matching between the antenna 180 and the other modules of the wireless communication device 100.

The antenna 180 receives an input signal from the outside environment. Further, the antenna 180 transmits the data signal modulated by the analog transceiver 160 to the outside environment. The input signal is a signal received from the outside environment and will be described in greater detail below with reference to FIG. 5.

In the wireless communication device 100, the PLL 111 may be always activated. Thus, in addition to power being used by the analog transceiver 160, power is additionally used to maintain the carrier frequency.

Further, if the PLL 111 is turned on and off a number of times, noise may be caused by on/off cycles, and drift may occur at an oscillating frequency of the oscillator 112 when the PLL 111 is deactivated/off.

Hereinafter, a wireless communication device and method for recovering a clock frequency without using the PLL 111 and the oscillator 112 will be described.

Figure 2:
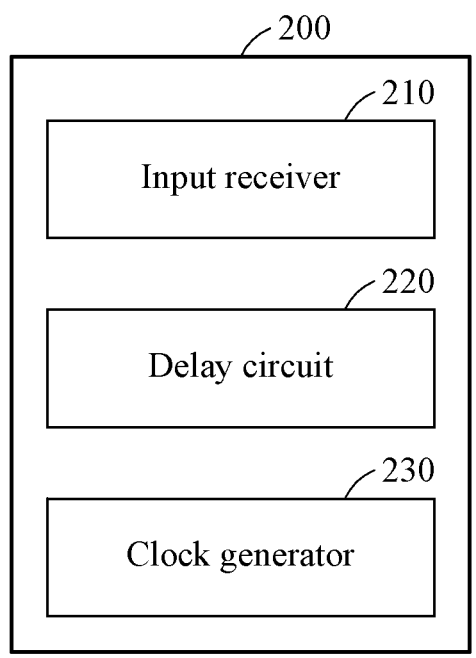
FIG. 2 illustrates an example of a configuration of a clock recovery unit of a wireless communication device.

FIG. 2 illustrates an example of a configuration of a clock recovery unit (or clock recoverer) 200 of a wireless communication device.

Referring to FIG. 2, the clock recovery unit 200 may include an input receiver 210, a delay circuit 220, and a clock generator 230.

The input receiver 210 receives an input signal with a carrier frequency. For example, the input receiver 210 receives the input signal from an outside environment through an antenna. The input signal may be, for example, a wireless signal for near field tag communication. If the antenna of the wireless communication device 200 is neighboring an external device (for example, an NFC reader), the input signal may be received from the external device through the antenna. The input signal may have one or more carrier-on intervals and one or more carrier-off intervals. A carrier-on interval is an interval in which a signal oscillating with a carrier frequency is present, and a carrier-off interval is an interval in which a signal oscillating with a carrier frequency is not present.

The delay circuit 220 generates a delayed signal by delaying the received input signal. For example, the delay circuit 220 generates the delayed signal by delaying the input signal for a target delay time. The delay circuit 220 delays the input signal for a time length determined by a delay-locked loop (DLL), which will be described in greater detail below with reference to FIG. 3.

The clock generator 230 generates a clock signal with a clock frequency from the delayed signal and the input signal. The clock generator 230 generates the clock signal with the clock frequency in consecutive intervals (for example, all intervals during which signals are received) by integrating the delayed signal and the input signal. For example, the clock generator 230 is implemented as a digital logic circuit, and generates a signal corresponding to a logical sum of the delayed signal and the input signal as the clock signal.

Even when a separate oscillator is not provided, the wireless communication device 200 may recover an unmodulated carrier signal (for example, a signal having only carrier-on intervals) through the delay circuit 220 from the modulated signal (for example, a signal having carrier-off intervals).

Figure 3:
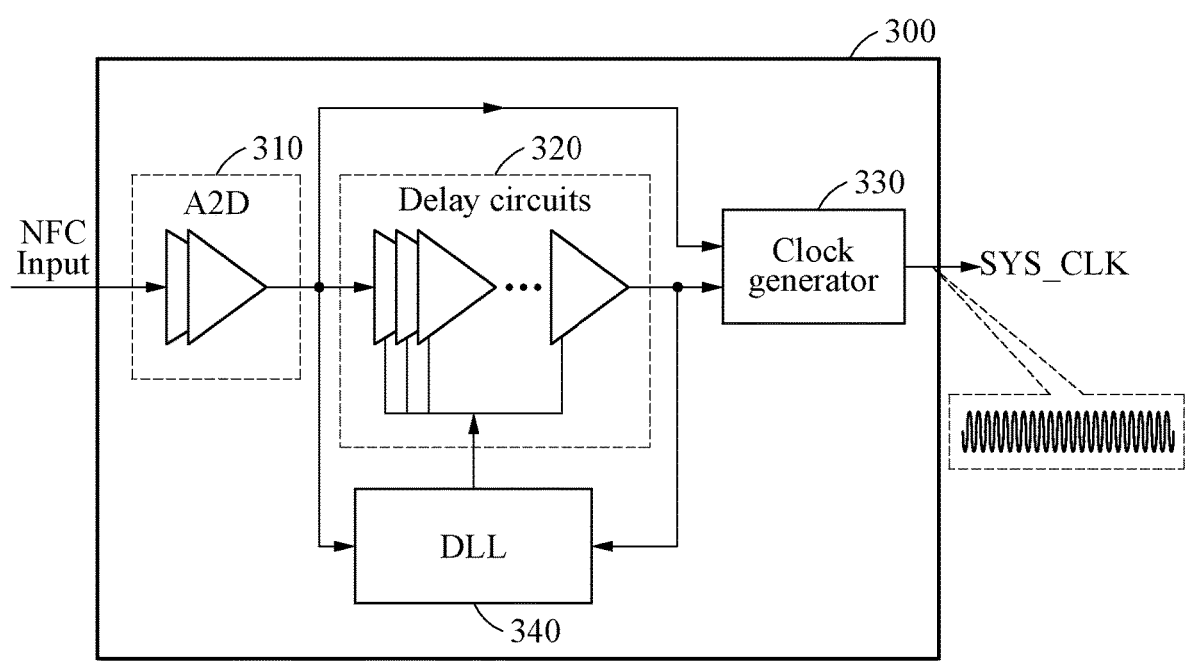
FIG. 3 illustrates an example of a configuration of a clock recovery unit of a wireless communication device.

FIG. 3 illustrates an example of a configuration of a clock recovery unit 300 of a wireless communication device.

Referring to FIG. 3, the clock recovery unit 300 may further include a DLL 340, in addition to elements corresponding to the elements shown in FIG. 2. That is, the clock recovery unit 300 may include the DLL 340, an input receiver 310, delay circuits 320, and a clock generator 330

First, an input receiver 310 may receive a signal from an outside environment. An analog signal received from the outside environment will be referred to as antenna input. The antenna input is a signal with a carrier frequency, and is present at a node at which an antenna and the input receiver 310 are connected to each other. The input receiver 310 may include an analog-to-digital converter (ADC). The ADC receives an analog input signal (for example, the antenna input) from the outside environment and converts the analog input signal into a digital input signal (for example, an input signal). Hereinafter, the input signal principally refers to a digital signal converted from the analog antenna input. However, the disclosure herein is not limited the input signal being a digital signal converted from the analog antenna input. The input signal may be, for example, a signal with a carrier frequency received from the outside environment. For example, the input signal may be an amplitude shift keying (ASK) signal with a modulation depth of 100%. The modulation depth is a ratio of a voltage of a logical state L (for example, a carrier-off interval) to a voltage of a logical state H (for example, a carrier-on interval) in an input envelope. The modulation depth of 100% indicates that the voltage of the logical state L is "0".

The delay circuit 320 generates a delayed signal by delaying the input signal, as described above with reference to FIG. 2. For example, the delay circuit 320 may generate the delayed signal having a carrier-off interval at a point in time different from a point in time of a carrier-off interval of the input signal. A time length for which the input signal is to be delayed by the delay circuit 320 is adjusted by the DLL 340, which will be described in greater detail below.

The DLL 340 adjusts the time length for which the input signal is to be delayed by the delay circuit 320 to a target delay time. The DLL 340 provides a delay control signal indicating a delay time length to the delay circuit 320. The delay circuit 320 delays the input signal for a time length corresponding to the provided delay control signal. For example, the DLL 340 detects a time difference between the input signal and the delayed signal and determines the delay control signal based on the detected time difference. The DLL 340 provides the determined delay control signal to the delay circuit 320. Further, when the time difference between the input signal and the delayed signal reaches the target delay time, the DLL 340 activates only an element maintaining the delay control signal provided to the delay circuit 320, and deactivates the other elements of the DLL 340. Thus, the DLL 340 may minimize or reduce the power consumption for maintaining the delay time.

The clock generator 330 generates a clock signal SYS_CLK based on a logical sum result of the input signal and the delayed signal. Since the delayed signal has a carrier-off interval at a point in time different from a point in time of the carrier-off interval of the input signal, the logical sum result of the input signal and the delayed signal may have consecutive carrier-on intervals. Thus, a logical sum result signal may be a signal with a carrier frequency in consecutive intervals (for example, all intervals during which signal is received).

The wireless communication device 300 may perform a near field tag communication operation at low power, without using an oscillator.

Figure 4:
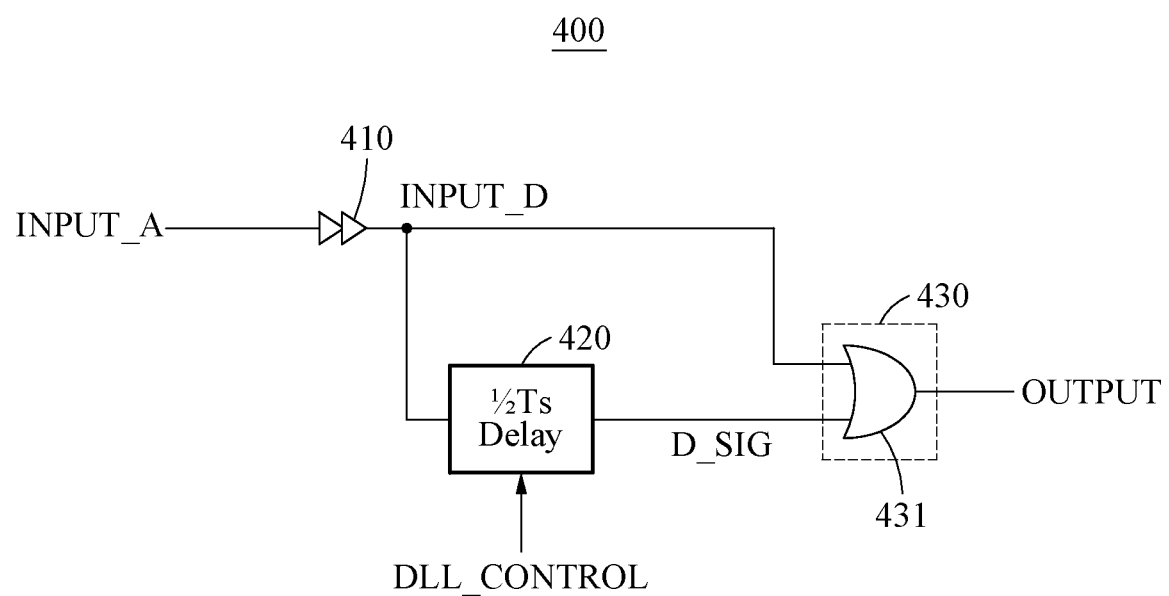
FIG. 4 illustrates an example of a circuit of a wireless communication device.
Figure 5:
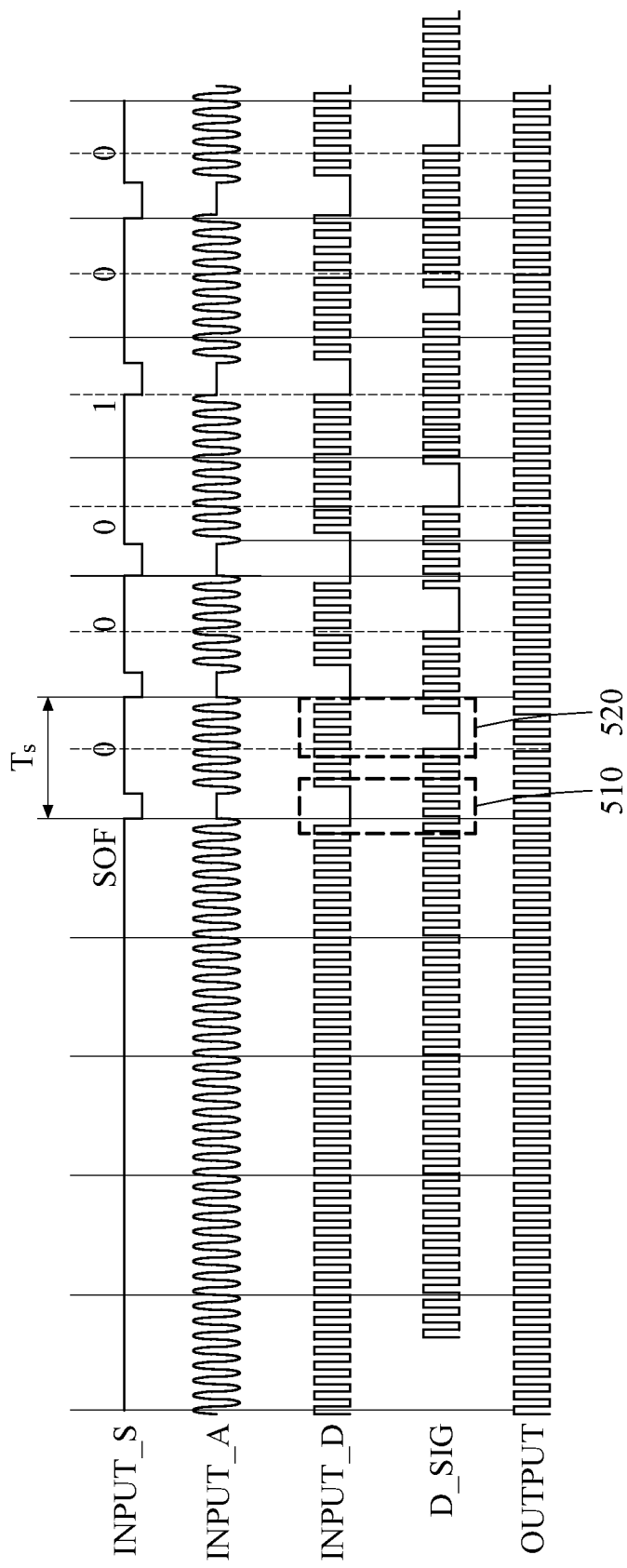
FIG. 5 illustrates an example of a timing diagram of the wireless communication device of FIG. 4.

FIG. 4 illustrates an example of a circuit of a wireless communication device 400. FIG. 5 illustrates an example of a timing diagram of the wireless communication device 400.

Referring to FIG. 4, the wireless communication device 400 converts an antenna input INPUT_A into a digital input signal INPUT_D through an input receiver 410. The input receiver 410 transmits the input signal INPUT_D to a delay circuit 420 and a clock generator 430.

The delay circuit 420 delays the input signal INPUT_D for a delay time length corresponding to a delay control signal DLL_CONTORL provided from a DLL. The delay circuit 420 generates a delayed signal having individual carrier-off intervals at points in time different from points in time of all carrier-off intervals of the input signal INPUT_D. That is, the delay circuit 420 generates a delayed signal D_SIG having a carrier-off interval at a point in time corresponding to a carrier-on interval of the input signal INPUT_D. Thus, the carrier-off intervals of the input signal INPUT_D may not overlap the carrier-off intervals of the delayed signal D_SIG. The carrier-on intervals of the input signal INPUT_D may include the carrier-off intervals of the delayed signal D_SIG, and the carrier-on intervals of the delayed signal D_SIG may include the carrier-off intervals of the input signal INPUT_D. The delay circuit 420 may generate the delayed signal D_SIG by delaying the input signal INPUT_D for a preset time length corresponding to a coding scheme applied to the input signal INPUT_D. That is because, depending on the coding scheme applied to the input signal INPUT_D, there may be a delay time length during which the carrier-off intervals of the delayed signal D_SIG and the carrier-off intervals of the input signal INPUT_D do not overlap at all.

The antenna input INPUT_A is, for example, a signal with a carrier frequency depending on an input symbol signal INPUT_S (FIG. 5). The input symbol signal INPUT_S may be a symbol signal to which a predetermined coding scheme (for example, Miller coding scheme) is applied may have an interval corresponding to a logical state L (low voltage) only for a portion of intervals during each symbol period $T_s$, as shown in FIG. 5. The antenna input INPUT_A may correspond to the input symbol signal INPUT_S and may have a carrier-off interval only corresponding to an interval of the input symbol signal that corresponds to the logical state L, as shown in FIG. 5. For example, the delay circuit 420 generates the delayed signal D_SIG by delaying the input signal INPUT_D for a half period $T_s/2$ of the symbol period $T_s$, as shown in FIG. 4. The carrier-off intervals of the signal D_SIG delayed for the half period $T_s/2$ and the carrier-off intervals of the input signal INPUT_D exist at different points in time, as shown in FIG. 5.

The clock generator 430 generates a logical sum result signal OUTPUT of the input signal INPUT_D and the delayed signal D_SIG. For example, the clock generator 430 includes a logical sum gate 431, for example, an OR gate, configured to generate a logical sum result of the input signal INPUT_D and the delayed signal D_SIG. As shown in FIG. 5, the delayed signal D_SIG carrier-on intervals during a first period 510 in which carrier-off intervals of the input signal INPUT_D exist, and the input signal INPUT_D has carrier-on intervals during a second period 520 in which carrier-off intervals of the delayed signal D_SIG exist. Thus, the logical sum result signal OUTPUT is a signal with an unmodulated carrier frequency in the first period 510 and the second period 520.

Hereinafter, an example of a coding scheme will be described with reference to FIG. 6.

Figure 6:
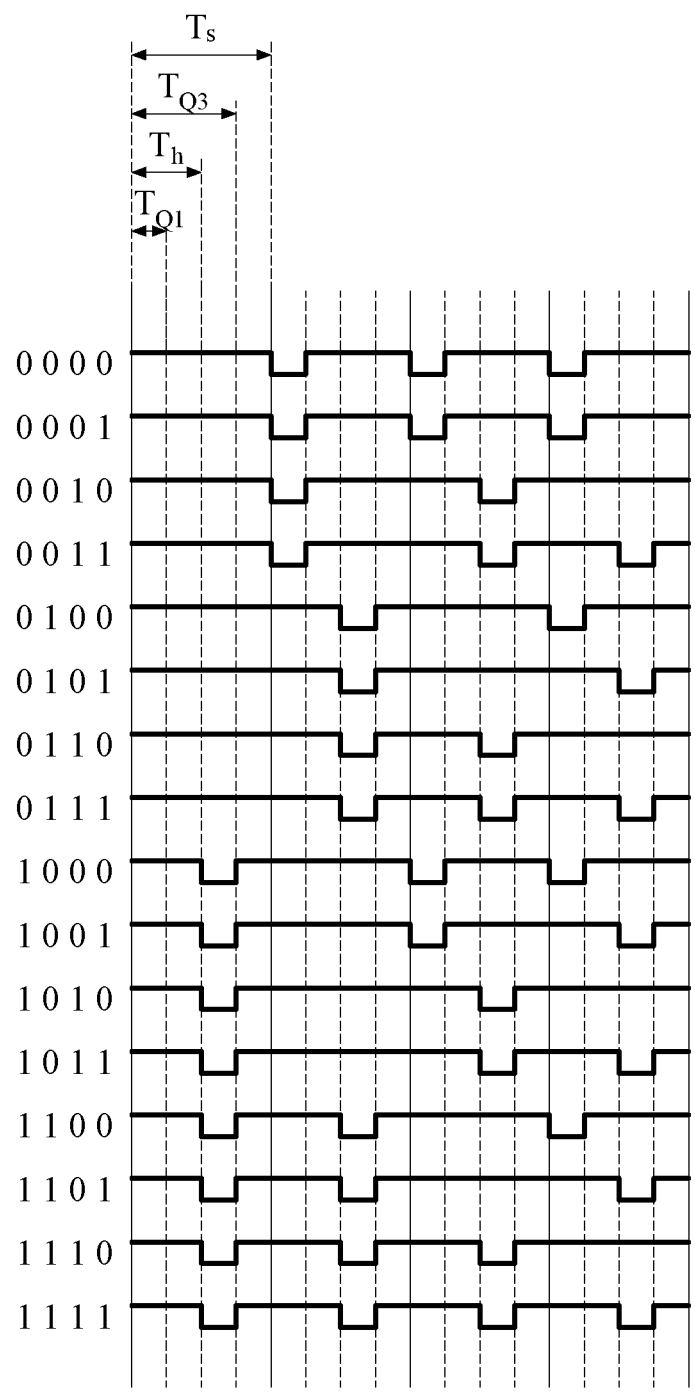
FIG. 6 illustrates an example of a coding applied to a signal received by a wireless communication device.

FIG. 6 illustrates an example of a coding applied to a signal received by a wireless communication device.

Referring to FIG. 6, a modified Miller coding system 600 is illustrated. An antenna input to which the Miller coding system 600 is applied and an input signal include unmodulated signals before a data frame and include modulated signals in a data frame period after a start of frame (SOF). A signal including a data frame is referred to as a data signal. An input envelope is an envelope with respect to an unmodulated signal before the SOF and thus, includes only a logical state H (high voltage). After the SOF, the input envelope is an envelope with respect to a modulated signal and thus, includes a logical state H or L. In the antenna input, an interval corresponding to the logical state H is referred to as a carrier-on interval, and an interval corresponding to the logical state L is referred to as a carrier-off interval.

In an example in which a symbol period is divided into 4 quarter intervals in the Miller coding system 600, carrier-off intervals may appear only in a first-quarter interval and a third-quarter interval, and carrier-on intervals may always appear in a second-quarter interval and a fourth-quarter interval, as shown in FIG. 6. That is, in FIGS. 4 and 5, an example in which a target delay time is a half period $T_h$ of the symbol period $T_s$ as is described. However, even when the target delay time is a time length between the first-quarter interval $T_{Q1}$, and the third-quarter interval $T_{Q3}$, a delayed signal generated by a delay circuit and the input signal do not have overlapping carrier-off intervals. Thus, the delay circuit may generate a delayed signal by delaying the input signal for a time length between the first-quarter interval $T_{Q1}$ and the third-quarter interval $T_{Q3}$, among the four quarter intervals with respect to the symbol period of the input signal.

However, examples are not limited to applying only the Miller coding system 600 to the input signal. Other coding schemes may also be applied to the input signal. A DLL may adjust a delay time length of the delay circuit to a target delay time respectively designated to each coding scheme.

Figure 7A:
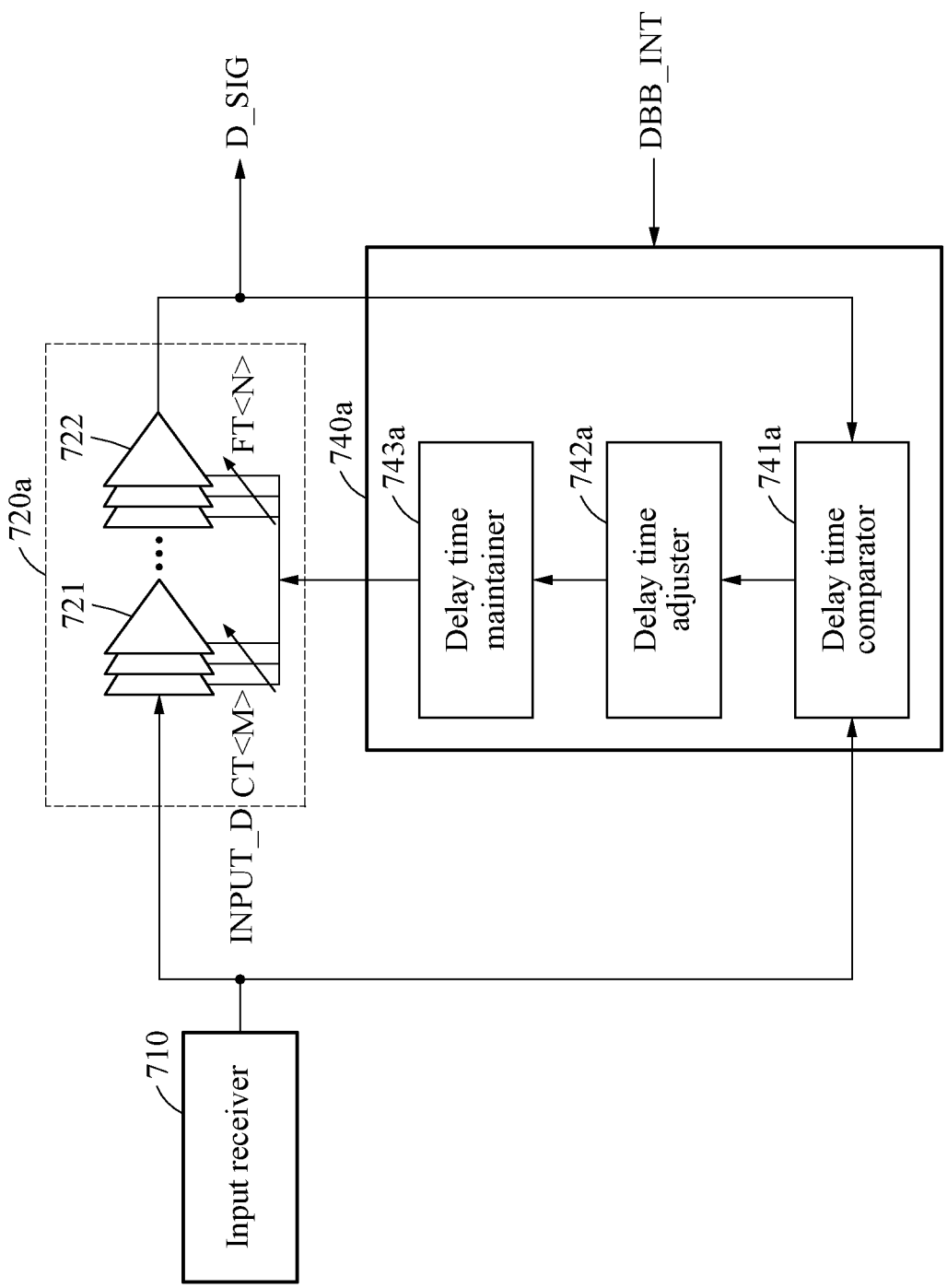
FIGS. 7A and 7B illustrate examples of configurations-+ of a delay-locked loop (DLL).
Figure 7B:
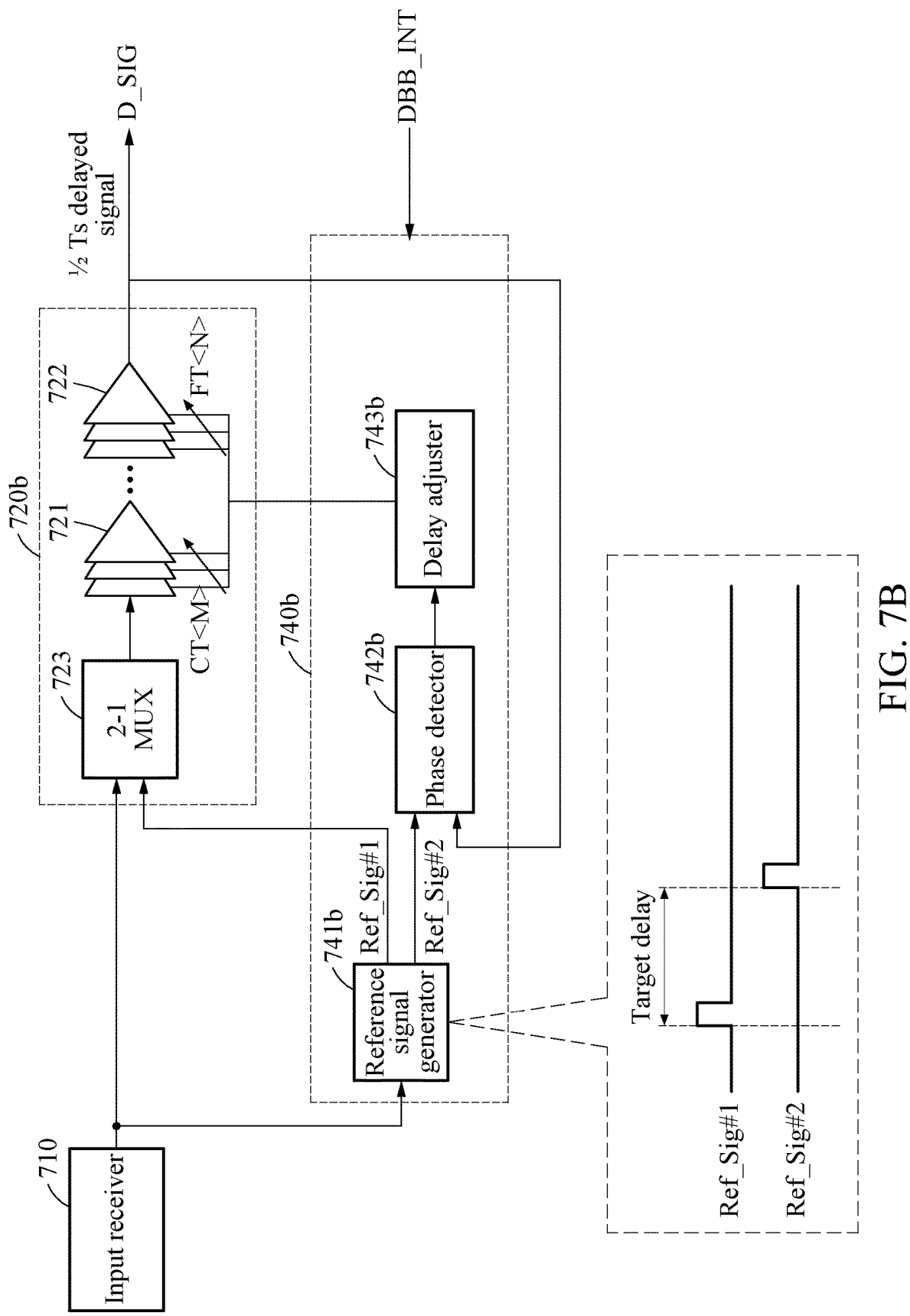

FIGS. 7A and 7B illustrate examples of configurations of a DLL.

Referring to FIG. 7A, a DLL 740a may include a delay time comparator 741a, a delay time adjuster 742a, and a delay time maintainer 743a. An input receiver 710 transmits an input signal INPUT_D to a delayer 720a and the DLL 740a. The delayer 720a generates a delayed signal D_SIG based on a currently provided delay control signal from the DLL 740a and transmits the delayed signal D_SIG to the delay time comparator 741a.

The DLL 740a adjusts a current delay time between the input signal INPUT_D and the delayed signal D_SIG to a target delay time. For example, the DLL 740a adjusts a delay time length of a delay circuit to the target delay time by iteratively changing the delay control signal until a difference between the current delay time and the target delay time is less than a threshold difference. For example, the DLL 740a initiates a delay calibration operation in response to the reception of an interrupt signal DBB_INT from a DBB unit of a wireless communication device. For example, the DLL 740a activates the delay time comparator 741a, the delay time adjuster 742a, and the delay time maintainer 743a in response to the reception of the interrupt signal DBB_INT. An iterative control signal change operation of the DLL 740a will be described below.

The delay time comparator 741a compares the input signal INPUT_D and the delayed signal D_SIG. The delay time comparator 741a calculates the current delay time between the input signal INPUT_D and the delayed signal D_SIG, and outputs a result of comparing the calculated current delay time and the target delay time. For example, the delay time comparator 741a compares a phase of the input signal INPUT_D received from the input receiver 710 and a phase of the delayed signal D_SIG passing through the delayer 720a, after the DLL 740a is activated. A time difference between the current delay time and the target delay time corresponds to a phase difference between the phase of the input signal INPUT_D and the phase of the delayed signal D_SIG. The delay time comparator 741a outputs a result that indicates a greater signal between the current delay time and the target delay time.

The delay time adjuster 742a receives the result of comparing the current delay time and the target delay time from the delay time comparator 741a, and changes a delay control signal based on the result of comparing. For example, the delay time adjuster 742a adjusts a delay time of the delayer 720a based on the phase comparison result described above.

In response to a difference between a current delay by the delayer 720a and a target delay being greater than or equal to a threshold difference, the delay time adjuster 742a changes the delay control signal. For example, in response to the difference between the current delay time from the input signal INPUT_D to the delayed signal D_SIG and the target delay time being greater than or equal to the threshold difference, the delay time adjuster 742a changes the delay control signal indicating the delay time length of the delay circuit. For example, in response to the current delay time being greater than the target delay time, the delay time adjuster 742a changes the delay control signal using a digital code indicating a delay time less than a previous delay time. For example, response to the current delay time being less than the target delay time, the delay time adjuster 742a changes the delay control signal using a digital code indicating a delay time greater than a previous delay time. The delay time adjuster 742a may iteratively perform the delay control signal change until the difference between the current delay time and the target delay time is less than the threshold difference. For ease of description, the above description is based on the time difference. However, the above description also applies to the phase difference.

Further, the delay calibration by the DLL 740a includes coarse tuning and fine tuning. For example, as shown in FIG. 7A, the delayer 720a includes a plurality of delay circuits 721 and 722. For example, the plurality of delay circuits 721 and 722 are connected in series from the input receiver 710 to an output of the delayer 720a and thereby form a series path. Each of the plurality of delay circuits 721 and 722 is configured to delay a signal by an individually set unit delay. Different unit delays may be respectively set for the plurality of delay circuits 721 and 722. However, the delayer 720a and the delay circuits 721 and 722 are not limited to the example configurations described above. For example, the same unit delay may be set for a portion of delay circuits among the plurality of 721 and 722.

The plurality of delay circuits 721 and 722 delays a signal or allows the signal to pass therethrough without a delay based on a delay control signal provided from the DLL 740a. For example, the delay control signal may include a digital code indicating activation and/or deactivation with respect to each of the plurality of delay circuits 721 and 722. The digital code may include a bit sequence including bits, wherein the number of bits corresponds to the number of the plurality of delay circuits 721 and 722. A bit value of an individual bit position in the digital code may indicate activation or deactivation of a delay circuit corresponding to the bit position. A delay circuit activated by the delay control signal delays a signal by a unit delay set for the corresponding delay circuit. The delay circuit deactivated by the delay control signal is excluded from a delay path of the DLL 740a, or allows a signal to pass therethrough without a delay.

The delay control signal may be divided into a coarse bit range CT<M> and a fine bit range FT<N>. The coarse bit range CT<M> is a set of bits for coarse tuning of a delay time, and the fine bit range FT<N> is a set of bits for fine tuning of the delay time. For example, among the plurality of delay circuits 721 and 722, the unit delay set for the first delay circuit 721 corresponding to the coarse bit range is greater than the unit delay set for the second delay circuit 722 corresponding to the fine bit range. The DLL 740a performs coarse tuning by first determining whether to activate the first delay circuit 721, and performs fine tuning by determining whether to activate the second delay circuit 722. In the example of FIG. 7A, there are M first delay circuits 721 and N second delay circuits 722. M and N are integers greater than or equal to "1". The coarse bit range CT<M> includes M bits, and the fine bit range FT<N> includes N bits. The delay control signal includes M+N bits. A unit delay set for a delay circuit corresponding to a more significant bit is greater than a unit delay set for a delay circuit corresponding to a less significant bit. Unit delays corresponding to individual bits decrease from the most significant bit (MSB) (for example, the (M+N)-th bit) to the least significant bit (LSB) of the delay control signal. The delay time adjuster 742a may iteratively perform the delay control signal change sequentially from the MSB to the LSB in the delay control signal.

The delay time maintainer 743a maintains the delay control signal determined by the delay time adjuster 742a.

For example, in an example in which the delay control signal is a digital code, the delay time maintainer 743a may be a memory device.

In response to the difference between the current delay by the delayer 720a and the target delay being less than the threshold difference, the DLL 740a deactivates at least a portion of the DLL 740a. For example, in response to the difference between the current delay time and the target delay time being less than the threshold difference, the DLL 740a maintains the delay time length of the delay circuit and is at least partially deactivated. For example, to maintain the delay time length of the delay circuit and to be at least partially deactivated, the DLL 740a supplies power to the delay time maintainer 743a and blocks power supply to the remaining elements of the DLL 740a (for example, the delay time adjuster 742a and the delay time comparator 741a).

Thus, the wireless communication device operates the DLL 740a until the time difference between the current delay time and the target delay time reaches the threshold difference. After the time difference reaches the threshold difference, the wireless communication device activates a portion of the elements (for example, the delay time maintainer 743a) and deactivates the other elements of the DLL, thereby reducing power consumption of the wireless communication device.

Referring to FIG. 7B, a DLL 740b includes a reference signal generator 741b, a phase detector 742b, and a delay adjuster 743b. In contrast to the example of FIG. 7A, the DLL 740b of FIG. 7B uses a reference signal to adjust a delay time by a delayer 720b.

First, for example, in response to the reception of an interrupt signal DBB_INT from a DBB unit, the DLL 740b initiates a delay adjustment operation. The input receiver 710 transmits an input signal to the delayer 720b and the DLL 740b. During the delay adjustment operation, a path selector 723 of the delayer 720b transmits, to the delay circuits 721 and 722, a reference signal generated by the reference signal generator 741b, instead of the input signal received through the input receiver 710. When the delay adjustment operation is completed, the delay time of the delayer 720b is locked, and the path selector 723 transmits the input signal received through the input receiver 710 to the delay circuits 721 and 722. For example, the path selector 723 is implemented as a 2:1 multiplexer (MUX), and the path selector 723 is disposed at a front end of the delayer 720b.

The reference signal generator 741b generates the reference signal to be used to adjust a delay during the delay adjustment operation. For example, in response to the interrupt signal DBB_INT, the reference signal generator 741b generates a first reference signal Ref_Sig #1 and a second reference signal Ref_Sig #2. The first and second reference signals Ref_Sig #1 and Ref_Sig #2 may each include a single pulse signal. The first reference signal Ref_Sig #1 is a single pulse signal generated from the input signal and is used as a standard for comparing a delay by the delayer 720b. The second reference signal Ref_Sig #2 is a single pulse signal delayed from the first reference signal Ref_Sig #1 for a target delay time. The reference signal generator 741b generates the second reference signal Ref_Sig #2 delayed from the first reference signal Ref_Sig #1 exactly for the target delay time. The reference signal generator 741b transmits the first reference signal Ref_Sig #1 to the delayer 720b. The reference signal generator 741b transmits the second reference signal Ref_Sig #2 to the phase detector 742b.

During the delay adjustment operation, the delayer 720b delays the first reference signal Ref_Sig #1 based on a currently provided delay control signal, and transmits a signal generated by delaying the first reference signal Ref_Sig #1 to the phase detector 742b.

The phase detector 742b compares a phase of the second reference signal Ref_Sig #2 to a phase of the first reference signal Ref_Sig #1 passing through the delayer 720b. The phase detector 742b determines whether a phase difference between the first reference signal Ref_Sig #1 and the second reference signal Ref_Sig #2 is less than a threshold difference. The phase difference between the first reference signal Ref_Sig #1 and the second reference signal Ref_Sig #2 corresponds to a difference between a current delay by the delayer 720b and a target delay.

The delay adjuster 743b adjusts the delay time of the delayer 720b based on a result of the comparison described above. Coarse tuning and fine tuning by the delay adjuster 743b are substantially the same as or similar to the coarse tuning and the fine tuning by the delay time adjuster 742a and the delay time maintainer 743a of the DLL 740a of FIG. 7A. Thus, a more detailed description of the coarse tuning and the fine tuning by the delay adjuster 743a will be omitted for conciseness.

When the delay calibration is completed, the DLL 740b maintains power supply with respect to the delay adjuster 743b and blocks power supply with respect to the remaining blocks of the DLL 740b, thereby minimizing the overall power consumption of the wireless communication device.

Figure 8:
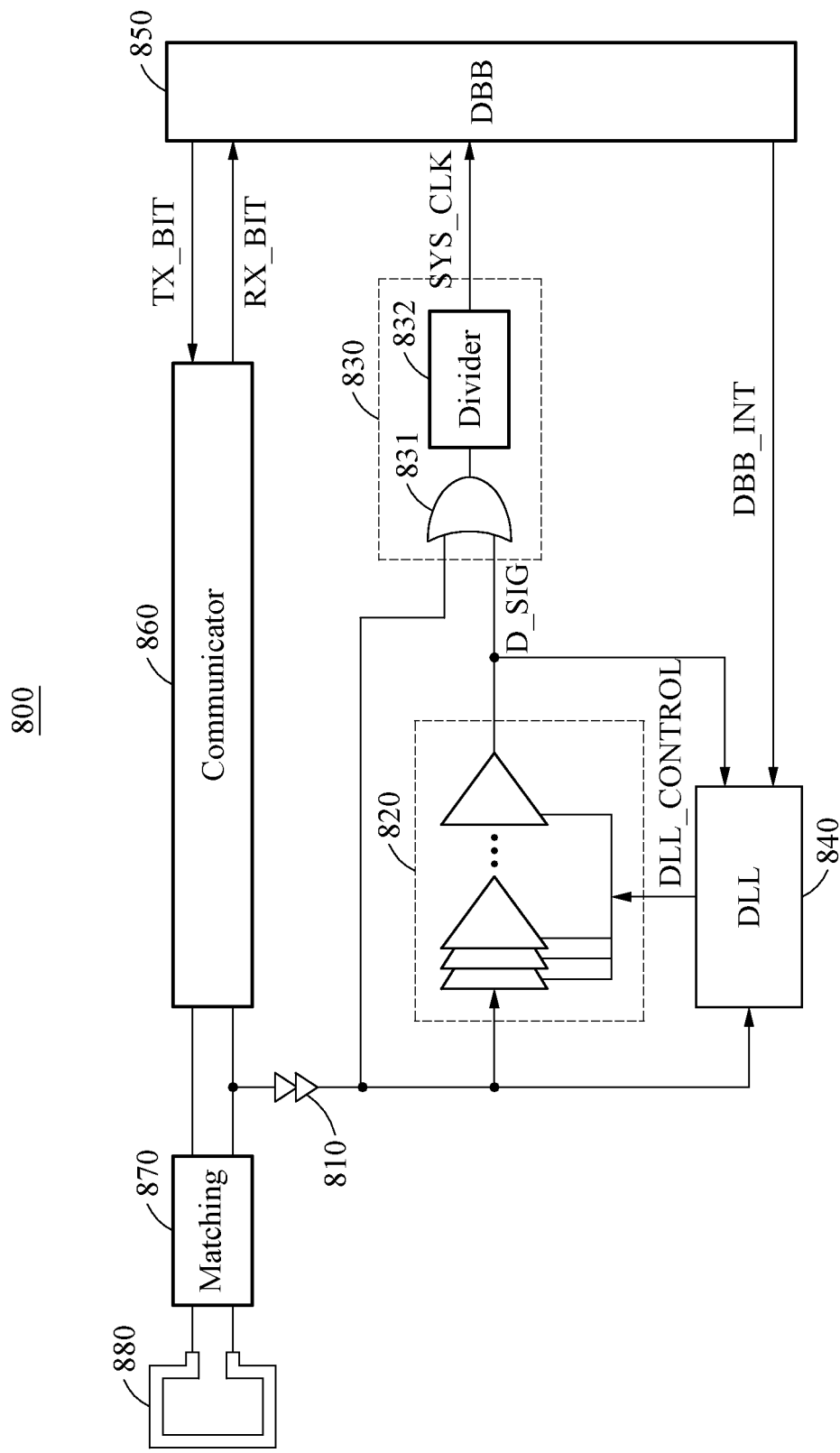
FIG. 8 illustrates an example of a configuration of a clock generator in a wireless communication device.

FIG. 8 illustrates an example of a configuration of a clock generator 830 in a wireless communication device 800.

Referring to FIG. 8, the wireless communication device 800 includes an input receiver 810, a delay circuit 820, a DLL 840, the clock generator 830, a DBB unit 850, a communicator 860, a matching unit 870, and an antenna 880.

Operations of the input receiver 810, the delay circuit 820, and the DLL 840 are the same as those described above with reference to FIGS. 2 through 7B, and thus a detailed description of such operations will be omitted for conciseness. For example, the DLL 840 automatically calibrates a delay time of the delay circuit 820 for a polling duration. The polling duration is a time duration set for an external device (for example, a near field communication reader) to search for a neighboring tag device (for example, a wireless communication device).

The clock generator 830 may include a logical sum gate 831 and a divider 832. The logical sum gate 831 generates a logical sum result signal of an input signal and a delayed signal, as described above. The divider 832 generates a clock signal SYS_CLK by dividing the logical sum result signal. For example, the divider 832 divides the logical sum result signal with a carrier frequency by a predetermined division ratio. If the division ratio is 1/8 and the carrier frequency of the input signal is 13.56 megahertz (MHz), the clock frequency of the clock signal SYS_CLK output from the divider 832 is 13.56 MHz/8=1.695 MHz. The divider 832 generates the clock signal SYS_CLK having a constant duty ratio from the logical sum result signal having a different duty ratio for each individual clock unit, which will be described later.

The DBB unit 850 operates using the generated clock signal SYS_CLK. Similar to the example described above, the DBB unit 850 may transfer a digital signal to the communicator 860 or receive a digital signal from the communicator 860, for communication. Further, in response to the first reception of an input signal received through the communicator 860, the DBB unit 850 generates an interrupt signal DBB_INT and transmits the interrupt signal DBB_INT to the DLL 840. The DLL 840 initiates a delay locking operation in response to the interrupt signal. After the delay time is locked, the DLL 840 activates a portion of the elements and deactivates the other elements.

The communicator 860 may perform operations the same as or similar to those of the analog transceiver 160 of FIG. 1. For example, the communicator 860 transmits and receives a data signal in an NFC band. After the delay time adjustment by the DLL 840 is completed, the communicator 860 may receive a data signal. The communicator 860 performs communication using the clock signal SYS_CLK described above.

For example, the wireless communication device 800 may be implemented as an NFC tag device compliant with ISO/IEC 14443 Type A. For example, the communicator 860 may receive and transmit a signal according to ISO/IEC 14443 Type A. The wireless communication device 800 may recover a clock frequency from the signal according to ISO/IEC 14443 Type A.

Figure 9:
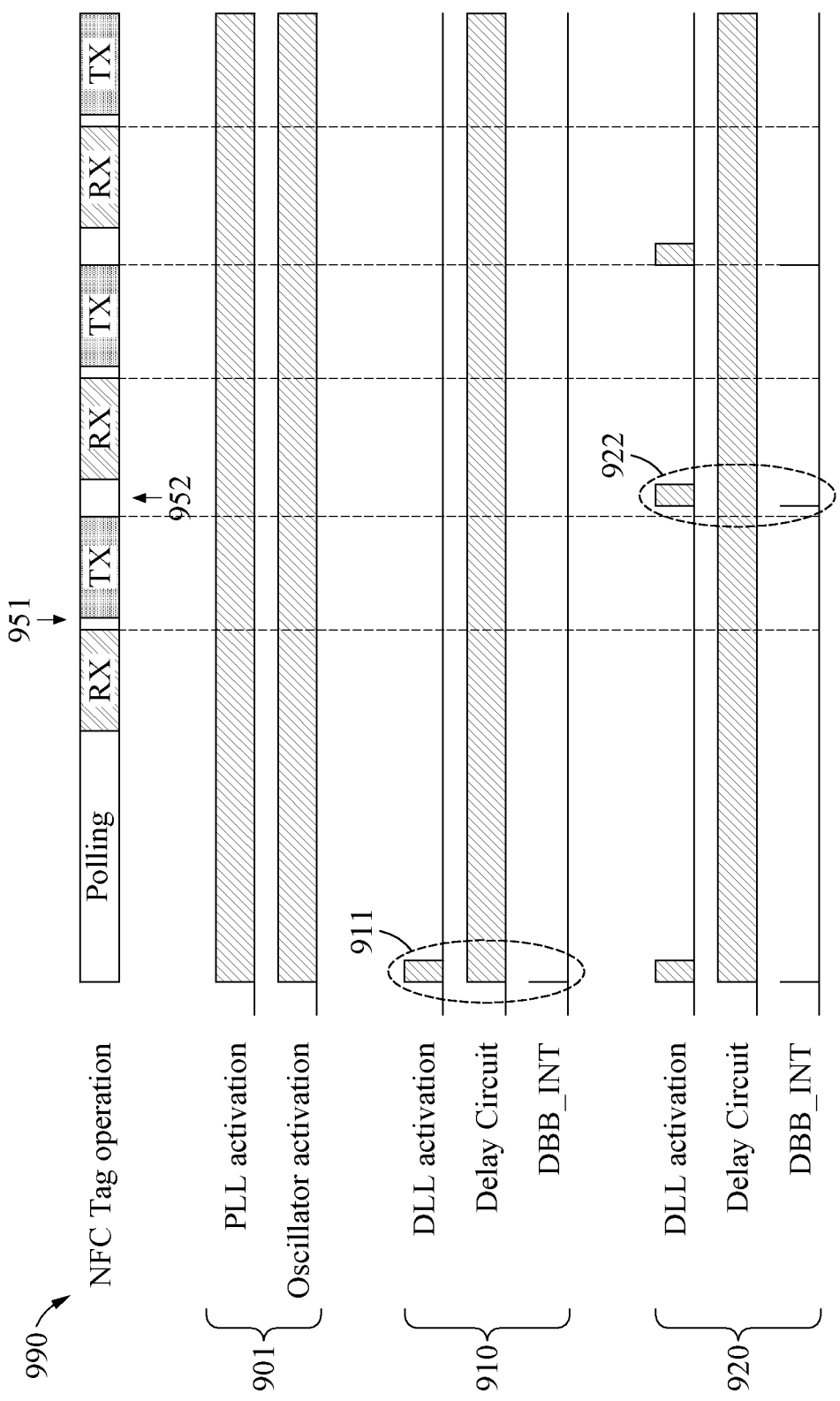
FIG. 9 illustrates an example of operation timings of a DLL.

FIG. 9 illustrates an example of operation timings of a DLL.

Referring to FIG. 9, an NFC tag operation 990 is performed, for example, in an order of a polling time, a receiving time, a first guard time 951, a transmitting time, and a second guard time 952. The first guard time 951 and the second guard time 952 are marginal times set to prevent crossing of a transmission signal and a reception signal during the NFC tag operation 990.

An operation 901 of the wireless communication device 100 of FIG. 1 includes operations of continuously activating the oscillator 112 and the PLL 111. Thus, power consumption of the wireless communication device 100 may be great.

Operation modes 910 and 920 of each of the wireless communication devices of FIGS. 2 through 8 include an operation of temporarily activating a DLL without an oscillator and an operation of continuously activating a delay circuit. The power consumption of the delay circuit is less than several microamperes (µA), and thus the power consumption is greatly reduced in comparison to power consumption by the PLL 111.

In response to an interrupt signal generated when a signal is received at first from an outside environment, a DLL initiates adjusting a delay time of the delay circuit. For example, in the first operation mode 910, the DLL adjusts the delay time of the delay circuit during a polling time of an input signal after the input signal is received. The polling time is, for example, less than or equal to 5 milliseconds (ms). The DLL completes adjusting the delay time during a portion 911 (for example, 100 microseconds (µs) or less) of the polling time.

Further, in the second operation mode 920, the DLL adjusts the delay time of the delay circuit during the second guard time 952 between a transmission operation and a reception operation in an NFC tag. In the NFC tag operation 990, the second guard time 952 is longer than the first guard time 951. The DLL iteratively readjusts the delay time of the delay circuit to a target delay time at each second guard time 952. Thus, errors to be accumulated over time are prevented, whereby the delay time of the delay circuit is calibrated more accurately. A DBB unit generates an interrupt signal at each second guard time 952 and provides the generated interrupt signal to the DLL. The DLL completes adjusting the delay time during a portion 922 of the second guard time 952, as well.

However, the timings at which the DLL operates are not limited to those shown in FIG. 9. The DLL calibrates a delay control signal during a portion of a plurality of second guard times 952, or calibrates the delay control signal during the first guard time 951. Further, examples are not limited to adjusting the delay time at each guard time. In response to an error between the current delay time and the target delay time at each guard time being greater than or equal to a threshold difference, the wireless communication device initiates the delay time adjustment operation.

Figure 10:
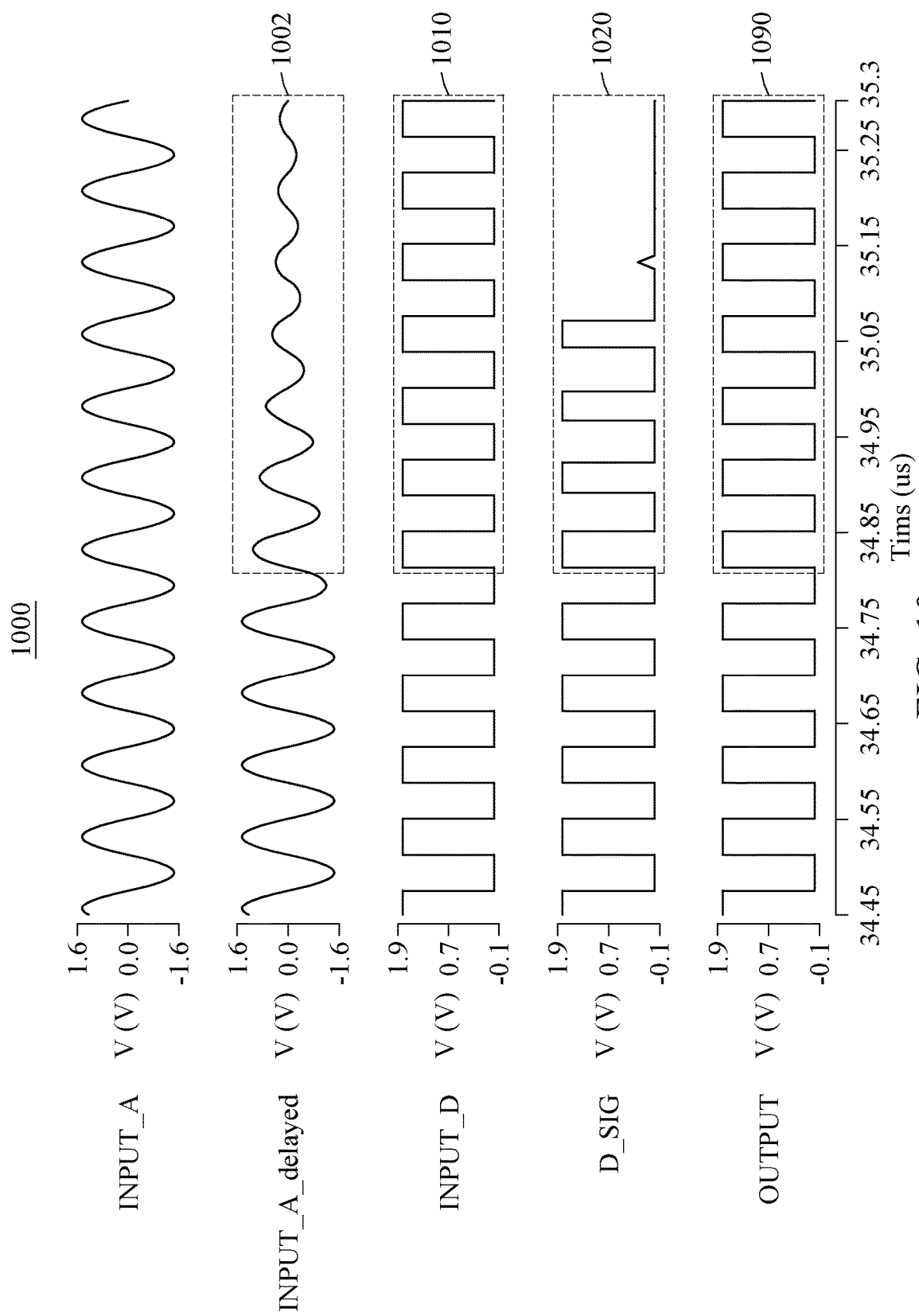
FIGS. 10 and 11 illustrate examples of clock recovery results.
Figure 11:
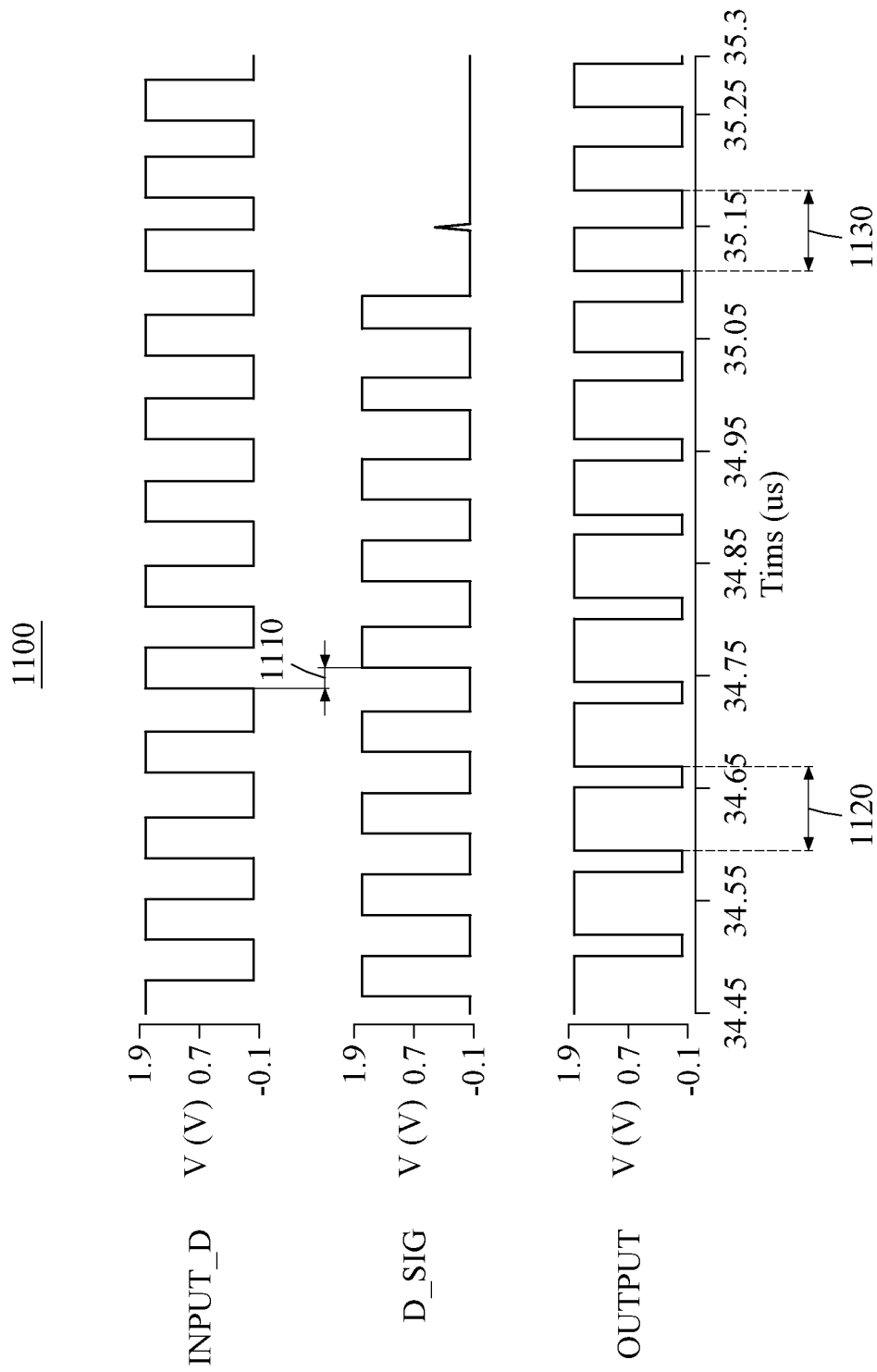

FIGS. 10 and 11 illustrate examples of clock recovery results.

FIG. 10 describes an example 1000 in which there is no clock error between an input signal and a delayed signal. For example, an antenna input INPUT_A swings with a perfect amplitude, whereas a delayed antenna input INPUT_A_delayed includes a period showing a waveform 1002 with a gradually decreasing amplitude. In this example, an input signal INPUT_D includes a period showing a waveform 1010 with a constant duty ratio, and a delayed signal D_SIG includes a period showing a waveform 1020 with a duty ratio that gradually decreases and vanishes. A logical sum result signal of the input signal INPUT_D and the delayed signal D_SIG, generated by a wireless communication device, has an unmodulated waveform 1090 with a constant frequency. Thus, even when there is a period during which the amplitude of the antenna input INPUT_A gradually decreases, the wireless communication device recovers a clock signal with a constant frequency.

FIG. 11 describes an example 1100 in which there is a clock error occurring between an input signal and a delayed signal. For example, in contrast to the example of FIG. 10, the example 1100 includes a clock error 1110 (corresponding to ¼ of a clock cycle Tc in FIG. 11) occurring between a clock of an input signal INPUT_D and a clock of a delayed signal D_SIG. A logical sum result signal OUTPUT generated by a wireless communication device shows an unmodulated signal with a constant frequency, despite the clock error 1110.

Further, in the logical sum result signal OUTPUT, a duty ratio of a predetermined clock 1120 may be different from a duty ratio of another clock 1130. The divider 832 of FIG. 8 generates a clock signal with a constant duty ratio (for example, a duty ratio of 50%) from the logical sum result signal OUTPUT. Thus, even when there is a clock error, the wireless communication device recovers a clock signal with a constant clock frequency and preserves a constant duty ratio of the clock signal.

Figure 12:
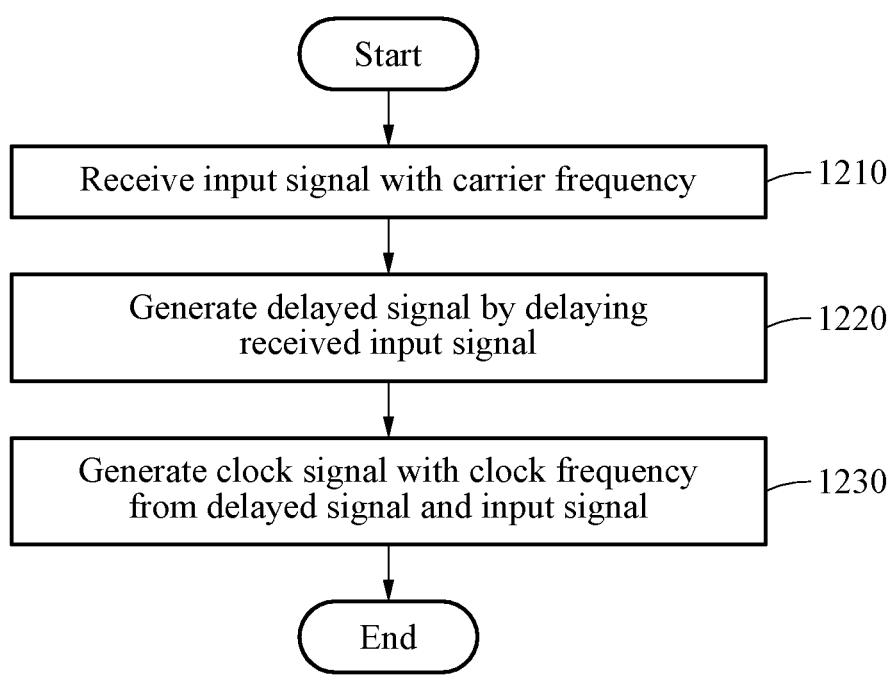
FIG. 12 illustrates an example of a clock frequency recovery method.

FIG. 12 illustrates an example of a clock frequency recovery method.

Referring to FIG. 12, first in operation 1210, a wireless communication device receives an input signal with a carrier frequency. For example, the wireless communication device receives an analog signal through an antenna and converts the analog signal into a digital input signal.

In operation 1220, the wireless communication device generates a delayed signal by delaying the received input signal. For example, a delay circuit of the wireless communication device delays the input signal for a target delay time in response to a delay control signal provided by a DLL.

In operation 1230, the wireless communication device generates a clock signal with a clock frequency from the delayed signal and the input signal. For example, the wireless communication device generates an output signal corresponding to a logical sum of the delayed signal and the input signal, and generates the clock signal by dividing the output signal.

However, the clock frequency recovery method is not limited to the example described above, and may be performed sequentially or in parallel with at least one of the operations described above with reference to FIGS. 1 to 11.

The wireless communication devices, the wireless communication devices 100, 200, 300, and 800, the PLL 110, the clock network 120, the DBBs 150 and 850, the matching units 170 and 870, the input receivers 210 and 710, the clock generators 230 and 330, the DLLs 340, 740*a*, 740*b*, and 840, the delay time comparator 741*a*, the delay time adjuster 742*a*, the delay time maintainer 743*a*, the reference signal generator 741*b*, the phase detector 742*b*, the delay adjuster 743*b*, the divider 832, the communicator 860, and other apparatuses, units, modules, devices, and components in FIGS. 1-12 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-12 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A device with wireless communication, comprising:
   an input receiver configured to receive an input signal having a carrier frequency;
   a delay circuit configured to generate a delayed signal by delaying the input signal; and
   a clock generator configured to generate a clock signal having a clock frequency based on the delayed signal and the input signal, wherein the delayed signal has a carrier-off interval at a point in time different from a point in time of a carrier-off interval of the input signal.

2. The device of claim 1, wherein the delayed signal has individual carrier-off intervals at points in time different from points in time of all carrier-off intervals among carrier-off intervals of the input signal.

3. The device of claim 1, wherein the delayed signal has a carrier-off interval at a point in time corresponding to a point in time of a carrier-on interval of the input signal.

4. The device of claim 1, wherein the delay circuit is further configured to generate the delayed signal by delaying the input signal for a preset time length corresponding to a coding scheme applied to the input signal.

5. The device of claim 1, wherein the delay circuit is further configured to generate the delayed signal by delaying the input signal for a time length between a first-quarter interval and a third-quarter interval, among four quarter intervals of a symbol period of the input signal.

6. The device of claim 1, wherein the delay circuit is further configured to generate the delayed signal by delaying the input signal for a half period of a symbol period.

7. The device of claim 1, further comprising:
   a delay-locked loop (DLL) configured to adjust a time length for which the input signal is delayed by the delay circuit to a target delay time.

8. The device of claim 7, wherein the DLL is further configured to change a control signal setting a delay time length of the delay circuit, in response to a difference between a current delay time of the delayed signal and the target delay time being greater than or equal to a threshold difference.

9. The device of claim 7, wherein the DLL is further configured to maintain a delay time length of the delay circuit and be at least partially deactivated, in response to a difference between a current delay time of the delayed signal and the target delay time being less than a threshold difference.

10. The device of claim 7, wherein the DLL is further configured to adjust a delay time length of the delay circuit during a polling time of the input signal after the input signal is received.

11. The device of claim 7, wherein the DLL is further configured to adjust a delay time length of the delay circuit during a guard time between a transmission operation and a reception operation in a near field communication (NFC) tag.

12. The device of claim 7, wherein the DLL is further configured to initiate adjusting a delay time length of the delay circuit, in response to an interrupt signal generated at either one or both of an initial point in time at which a signal is received from outside environment and a guard time between a transmission operation and a reception operation.

13. The device of claim 1, wherein the clock generator is further configured to generate the clock signal based on a logical sum result signal of the input signal and the delayed signal.

14. The device of claim 1, further comprising:
   a digital baseband (DBB) unit configured to operate using the generated clock signal.

15. The device of claim 1, wherein the input receiver comprises an analog-to-digital converter (ADC) configured to receive an analog input signal from an outside environment and convert the analog input signal into a digital input signal constituting the input signal having the carrier frequency.

16. A device with wireless communication, comprising:
   an input receiver configured to receive an input signal having a carrier frequency;
   a delay circuit configured to generate a delayed signal by delaying the input signal; and
   a clock generator configured to generate a clock signal having a clock frequency based on the delayed signal and the input signal, wherein the clock generator is further configured to generate the clock signal based on a logical sum result signal of the input signal and the delayed signal.

17. The device of claim 16, wherein the clock generator comprises a divider configured to generate the clock signal by dividing the logical sum result signal.

18. The device of claim 16, wherein the clock generator comprises a divider configured to generate the clock signal by dividing the logical sum result signal.

19. A device with wireless communication, comprising:
   an input receiver configured to receive an input signal having a carrier frequency;
   a delay circuit configured to generate a delayed signal by delaying the input signal;
   a clock generator configured to generate a clock signal having a clock frequency based on the delayed signal and the input signal; and
   a digital baseband (DBB) unit configured to operate using the generated clock signal.

20. A device with wireless communication, comprising:
   an input receiver configured to receive an input signal having a carrier frequency;
   a delay circuit configured to generate a delayed signal by delaying the input signal; and
   a clock generator configured to generate a clock signal having a clock frequency based on the delayed signal and the input signal, wherein the input receiver comprises an analog-to-digital converter (ADC) configured to receive an analog input signal from an outside environment and convert the analog input signal into a digital input signal constituting the input signal having the carrier frequency.

21. A method of recovering a clock frequency, the method comprising:
receiving an input signal having a carrier frequency;
generating a delayed signal by delaying the input signal; and
generating a clock signal having a clock frequency from the delayed signal and the input signal, wherein the delayed signal has carrier-off intervals that are non-overlapping with carrier-off intervals of the input signal.

22. The method of claim 21, wherein a timing of a carrier-off interval of the delayed signal corresponds to a timing of a carrier-on interval of the input signal.

23. The method of claim 21, further comprising:
adjusting a time length for which the input signal is delayed to a target delay time.

24. The method of claim 23, wherein the adjusting of the time length for which the input signal is delayed comprises:
changing a control signal setting a delay time length of a delay circuit, in response to a difference between a current delay time of the delayed signal and the target delay time being greater than or equal to a threshold difference; or
maintaining the delay time length of the delay circuit and at least partially deactivating the delay circuit, in response to the difference between the current delay time of the delayed signal and the target delay time being less than the threshold difference.

25. The method of claim 23, wherein the adjusting of the time length for which the input signal is delayed comprises adjusting a delay time length of a delay circuit during a polling time of the input signal after the input signal is received.

26. The method of claim 23, wherein the adjusting of the time length for which the input signal is delayed comprises adjusting a delay time length of a delay circuit during a guard time between a transmission operation and a reception operation in a near field communication (NFC) tag.

27. The method of claim 23, wherein the adjusting of the time length for which the input signal is delayed comprises initiating adjusting a delay time length of a delay circuit, in response to an interrupt signal generated at either one or both of an initial point in time at which a signal is received from an outside environment and a guard time between a transmission operation and a reception operation.

28. The method of claim 21, wherein the generating of the clock signal comprises dividing a logical sum result signal of the input signal and the delayed signal.

29. A method of recovering a clock frequency, the method comprising:
receiving an input signal having a carrier frequency;
generating a delayed signal by delaying the input signal; and
generating a clock signal having a clock frequency from the delayed signal and the input signal, wherein the generating of the clock signal comprises dividing a logical sum result signal of the input signal and the delayed signal.

30. A device with wireless communication, comprising:
an input receiver configured to receive an input signal having a carrier frequency;
a delay circuit configured to generate a delayed signal by delaying the input signal;
a delay-locked loop (DLL) configured to control operation of the delay circuit by setting a delay time length of the delay circuit based on a target delay time of the delayed signal; and
a clock generator configured to generate a clock signal having a clock frequency based on the delayed signal and the input signal,
wherein the delayed signal has a carrier-off interval at a point in time corresponding to a point in time of a carrier-on interval of the input signal.

31. The device of claim 30, wherein the DLL is configured to adjust the delay time length of the delay circuit until a difference between a current delay time of the delayed signal and the target delay time is less than a threshold difference, and
wherein the DLL is configured to deactivate elements of the DLL in response to the difference between the current delay time and the target delay time being less than the threshold difference.

* * * * *